(12) United States Patent
Kato

(10) Patent No.: US 6,580,592 B2
(45) Date of Patent: Jun. 17, 2003

(54) SEMICONDUCTOR DEVICE

(75) Inventor: Katsuhiro Kato, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 0 days.

(21) Appl. No.: 09/834,882

(22) Filed: Apr. 16, 2001

(65) Prior Publication Data

US 2002/0050617 A1 May 2, 2002

(30) Foreign Application Priority Data

Oct. 30, 2000 (JP) ........................................ 2000-331202

(51) Int. Cl.[7] .................................................. H02H 9/04
(52) U.S. Cl. .......................................... 361/56; 361/111
(58) Field of Search ................................ 257/360, 355, 257/356, 357, 363, 364; 438/284; 361/90, 91.1, 92, 100, 98, 101, 56, 111, 91.5

(56) References Cited

U.S. PATENT DOCUMENTS

| | | | |
|---|---|---|---|
| 5,561,312 A | * 10/1996 | Nozoe et al. | ............... 257/357 |
| 5,804,998 A | * 9/1998 | Cahill et al. | ................... 326/68 |
| 6,091,594 A | * 7/2000 | Williamson et al. | ........ 361/111 |
| 6,285,537 B2 | * 9/2001 | Allen | .......................... 326/83 |

* cited by examiner

Primary Examiner—Kim Huynh
(74) Attorney, Agent, or Firm—Venable; James R. Burdett

(57) ABSTRACT

A semiconductor device having an input circuit for effectively preventing breakdown caused by an electrostatic surge is provided. A first NMOS transistor is connected between an input terminal and an internal node, and a gate electrode of the first NMOS transistor is connected to a power supply line via a PMOS transistor that is always in an ON state. Therefore, the first NMOS transistor is also always in the ON state. Further, a second NMOS transistor, which is always in an OFF state, is connected between the internal node and a ground line. Even when an electrostatic surge voltage is applied to the input terminal, the electrostatic surge voltage is not directly applied to the gate electrode of the first NMOS transistor. Thus, breakdown of a gate oxide film of the gate is prevented.

8 Claims, 8 Drawing Sheets

SEMICONDUCTOR DEVICE

BACKGROUND OF THE INVENTION

1. Field of the Invention

The present invention relates to a semiconductor device, and more particularly to a technique of preventing electrostatic breakdown of an input circuit.

2. Description of the Related Art

FIGS. 2A and 2B illustrate input circuits of conventional semiconductor devices. FIG. 2A shows an ordinary input circuit which is used when a level of an input signal IN is less than or equal to a power supply voltage VCC, and FIG. 2B shows an input circuit which can be used when an input signal IN is higher than a power supply voltage VCC.

The semiconductor device shown in FIG. 2A has a power supply terminal 1 connected to a power supply voltage VCC (e.g., 3.3 V), a ground terminal 2 connected to a ground voltage GND, and an input terminal 3 to which an input signal IN is input. A power supply line 4 for supplying the power supply voltage VCC into the semiconductor device is connected to the power supply terminal 1, and a ground line 5 for supplying a ground voltage GND is connected to the ground terminal 2.

An N-channel MOS transistor (hereinafter referred to as an "NMOS") 6 for protection against electrostatic breakdown is connected between the input terminal 3 and the ground line 5, and a gate of this NMOS is connected to the ground line 5. Further, the input terminal 3 is connected to gates of a P-channel MOS transistor (hereinafter referred to as a "PMOS") 8a and an NMOS 8b, which together form a CMOS inverter 8, via a resistor 7 for protection against an excess current. The input signal IN is inverted by the CMOS inverter 8 and is supplied to an internal circuit (not shown).

In the semiconductor device having the above-described structure, when an electrostatic surge voltage is applied to the input terminal 3 with reference to the ground terminal 2, a surge current flows from the input terminal 3 through drain and source regions of the protective NMOS 6 to the ground terminal 2, and is dissipated. When an electrostatic surge voltage is applied to the input terminal 3 with reference to the power supply terminal 1, a surge current flows from the input terminal 3 through the drain and source regions of the protective NMOS 6 to the ground line 5, and then flows via a parasitic diode 9 to the power supply terminal 1 and is dissipated. This prevents the electrostatic surge current caused by the electrostatic surge voltage applied to the input terminal 3 from flowing into the CMOS inverter 8, thereby protecting the internal circuit from electrostatic breakdown.

The semiconductor device shown in FIG. 2B has a power supply terminal 1 connected to a power supply voltage VCC (e.g., 3.3 V), a ground terminal 2 connected to a ground voltage GND, and an input terminal 3 to which an input signal IN (e.g., 5 V) is input. A power supply line 4 for supplying the power supply voltage VCC into the semiconductor device is connected to the power supply terminal 1, and a ground line 5 for supplying a ground voltage GND is connected to the ground terminal 2.

Two NMOSs 6a and 6b are connected in series between the input terminal 3 and the ground line 5. A gate of the NMOS 6a at the input terminal 3 side is connected to the power supply line 4, and a gate of the NMOS 6b at the ground line 5 side is connected to the ground line 5. Further, the input terminal 3 is connected to a transfer gate 10 via a resistor 7, and an input signal IN switched at the transfer gate 10 is supplied to an internal circuit (not shown).

In the semiconductor device shown in FIG. 2B, when an input signal IN of 5 V is input to the input terminal 3, the voltage of the input signal IN is dropped to a predetermined voltage by the resistor 7, and the signal is supplied to the internal circuit via the transfer gate 10.

The gate of the NMOS 6a is always applied with the power supply voltage of 3.3 V. Thus, a voltage (a potential difference) between drain and gate regions of the NMOS 6a will not exceed 1.7 V even when an input signal IN of 5 V is input to the input terminal 3. Further, since the drain voltage of the NMOS 6b is clamped at 3.3 minus Vth volts (Vth represents a threshold voltage of a NMOS and is usually about 0.4 V–0.6 V) by the NMOS 6a, the voltage between the drain and gate regions will not exceed the power supply voltage VCC. Therefore, since a withstand voltage of gate oxide films of the NMOSs 6a and 6b is sufficient at about 3.3 V, which is the same as that of an gate oxide film of a device forming the internal circuit, the oxide films of the NMOSs 6a and 6b can be produced by a fabrication process similar to that for the internal circuit.

However, in such conventional semiconductor devices, there has been the problem that when an input circuit is structured as shown in FIG. 2B to accommodate an input signal IN of a voltage higher than a power supply voltage VCC, the ability to protect against an electrostatic surge is inferior in comparison to a case in which the circuit shown in FIG. 2A is utilized.

That is, in FIG. 2B, when an electrostatic surge voltage is applied to the input terminal 3 with reference to the ground terminal 2, a surge current flows from the input terminal 3 through the protective NMOSs 6a and 6b to the ground terminal 2. However, a large electrostatic capacity due to the semiconductor devices exists between the ground line 5 connected to the ground terminal 2 and the power supply line 4 connected to the gate of the NMOS 6a. Therefore, the electric potential of the ground terminal 2 and the electric potential of the power supply terminal 1 alternatingly become the same, and the electrostatic surge voltage is applied to the drain-gate region of the NMOS 6a, thereby breakdown of the gate oxide film easily caused. This breakdown phenomenon becomes a more direct and serious problem when an electrostatic surge voltage is applied to the input terminal 3 with reference to the power supply terminal 1.

SUMMARY OF THE INVENTION

An object of the present invention is to solve the aforementioned problem of the prior art by providing a semiconductor device having an input circuit which can effectively prevent breakdown caused by an electrostatic surge.

In order to accomplish the above described object, a first aspect of the present invention is a semiconductor device for receiving an input signal, and power supply voltages, the semiconductor device including: an input line for receiving the input signal, first and second power supply lines for receiving power supply voltages, and an internal node; a first MOS transistor of a first conductive type, the first MOS transistor having a source electrode, a drain electrode, and a gate electrode, with the source electrode connected to the input line and the drain electrode connected to the internal node; a circuit element disposed between the first power supply line and the gate electrode of the first MOS transistor for applying a power supply voltage to the first MOS transistor gate electrode which maintains the first MOS transistor in an ON state; and a second MOS transistor of the first conductive type disposed between the second power supply line and the internal node, the second MOS transistor having a source electrode connected to the second power supply line, a drain electrode connected to the internal node, and a gate electrode connected to the second power supply line.

In a second aspect of the present invention, the circuit element in the first aspect is a third MOS transistor of a second conductive type having a gate electrode connected to the second power supply line, with the third MOS transistor being maintained in the ON state, or is a resistor element.

Operation in a semiconductor device structured as described above according to the first and the second aspects of the present invention is as follows.

When an electrostatic surge voltage is applied to the input line from outside, the electrostatic surge current flows toward the first or the second power supply line via the first and the second MOS transistors. The gate electrode of the first MOS transistor is connected to the first power supply line via the circuit element such as the third MOS transistor in the ON state or the resistor. Therefore, the electrostatic surge voltage is not directly applied to the gate electrode of the first MOS transistor.

A third aspect of the present invention is the device of the first aspect, further including a protection device connecting the gate electrode of the first MOS transistor and the internal node to one another.

A fourth aspect of the present invention is the device of the third aspect, wherein the protection device is a fourth MOS transistor of the first conductive type having a gate electrode connected to at least one of the internal node and the second power supply line, with the fourth MOS transistor being maintained in an OFF state.

Operation in the third and the fourth aspects is as follows.

When an electrostatic surge voltage is applied to the input line from outside, an electrostatic surge current flows toward the internal node via the first MOS transistor, and further toward the first or the second power supply line via the second MOS transistor. When the electrostatic surge current reaches the internal node, the protection device becomes conductive and short-circuits the gate-source region of the first MOS transistor. This prevents breakdown of the gate oxide film of the first MOS transistor caused by the electrostatic surge.

A fifth aspect of the present invention is the device of the first aspect, further including a fifth MOS transistor diode-connected in a reverse bias direction between the first and second power supply lines.

A sixth aspect of the present invention is the device of the fourth aspect, further including a fifth MOS transistor diode-connected in a reverse bias direction between the first and second power supply lines.

According to the fifth and the sixth aspects of the present invention, since the fifth MOS transistor is provided between the first and the second power supply lines and thus the first and the second power supply lines are connected by a reverse-biased diode, breakdown of a circuit due to an electrostatic surge can be prevented even in a semiconductor having an SOI (Silicon On Insulator) structure which does not have parasitic diodes.

A seventh aspect of the present invention is the device of the fourth aspect wherein impurity diffusion layers respectively corresponding to source electrodes of the first and the fourth MOS transistors are integrally formed on a semiconductor substrate. Thus, a required pattern area can be reduced.

A eighth aspect of the present invention is the device of the sixth aspect wherein impurity diffusion layers respectively corresponding to source electrodes of the first and the fourth MOS transistors are integrally formed on a semiconductor substrate; and the fourth and the fifth MOS transistors are designed so that a distance between the gate electrode and a source contact hole of the fourth MOS transistor is longer than a distance between a gate electrode and a source contact hole of the fifth MOS transistor, and a distance between the gate electrode and a drain contact hole of the fourth MOS transistor is longer than a distance between the gate electrode and a drain contact hole of the fifth MOS transistor. This makes a response from the fifth MOS transistor to an electrostatic surge faster, and therefore most of the surge current flows via this fifth MOS transistor, thereby preventing breakdown of the fourth MOS transistor.

DESCRIPTION OF THE PREFERRED EMBODIMENTS

First Embodiment

Figure 1:
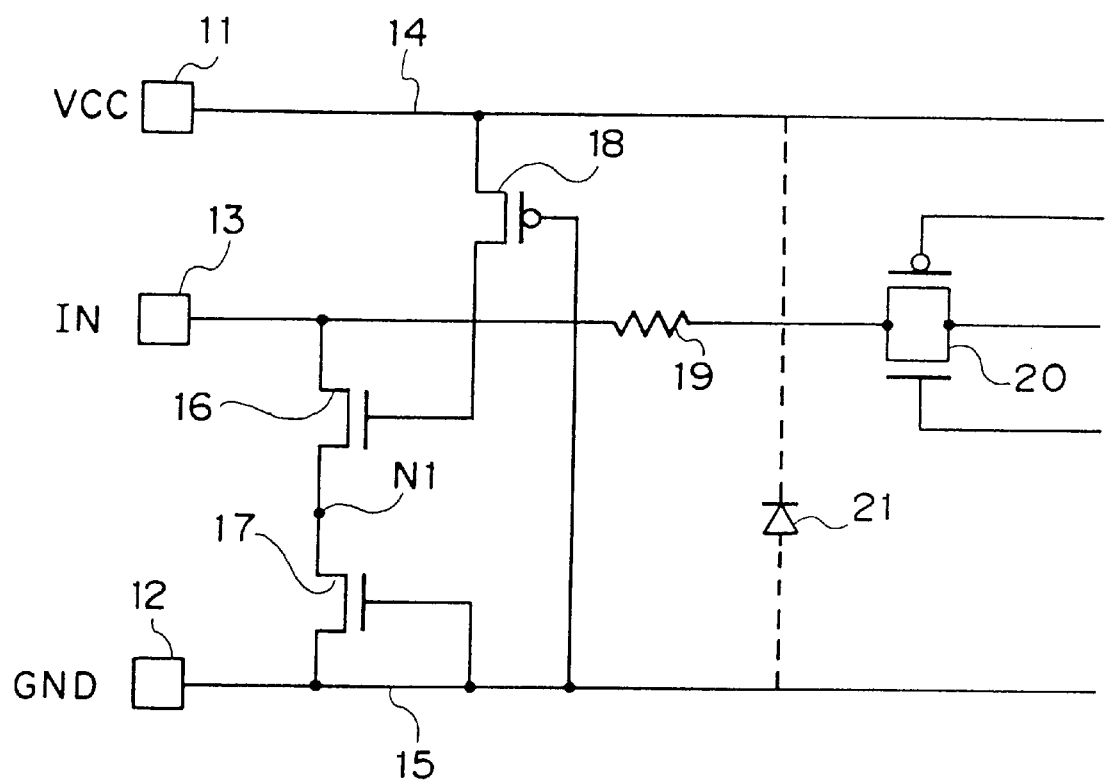
FIG. 1 illustrates an input circuit of a semiconductor device of a first embodiment of the present invention.
Figure 2A:
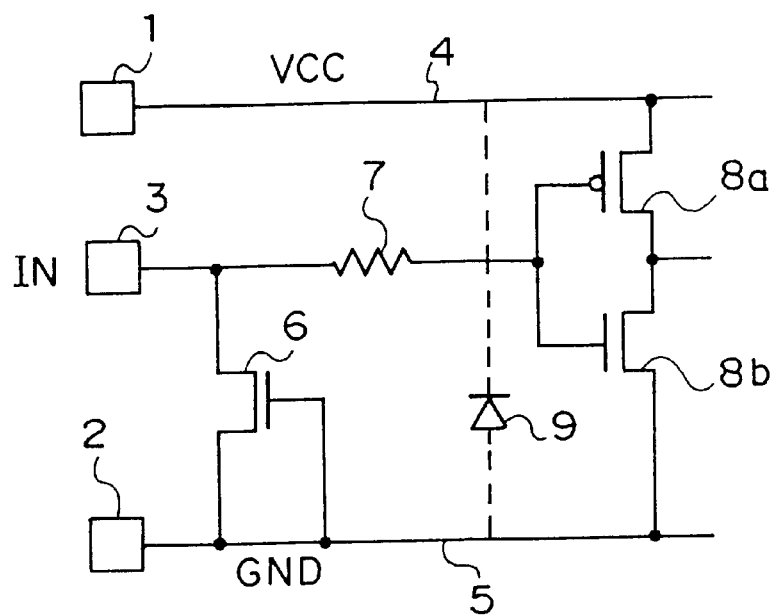
FIGS. 2A and 2B illustrate input circuits of conventional semiconductor devices.
Figure 2B:
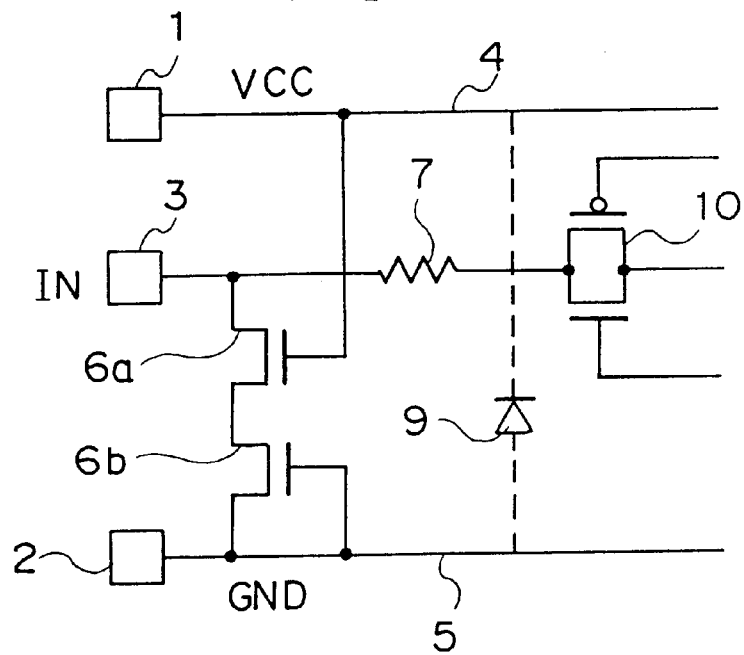

FIG. 1 illustrates an input circuit of a semiconductor device of a first embodiment of the present invention.

The semiconductor device has a power supply terminal 11 connected to a power supply voltage VCC (e.g., 3.3 V), a ground terminal 12 connected to a ground voltage GND, and an input terminal 13 to which an input signal IN (e.g., 5 V) is applied. A power supply line 14 for supplying the power supply voltage VCC into the semiconductor device is connected to the power supply terminal 11, and a ground line 15 for supplying the ground voltage GND is connected to the ground terminal 12.

Two NMOSs 16 and 17 for protection against electrostatic breakdown are connected in series via an internal node N1 between the input terminal 13 and the ground line 15. A gate of the NMOS 16 at the input terminal 13 side is connected to the power supply line 14 via a protection PMOS 18, and a gate of the PMOS 18 is connected to the ground line 15. A gate of the NMOS 17 at the ground line 15 side is connected to the ground line 15.

Further, the input terminal 13 is connected to a transfer gate 20 via a resistor 19 for protection against excess current, and an input signal IN switched at this transfer gate 20 is supplied to an internal circuit (not shown).

Next, operation of the input circuit is described.

When an input signal IN of 5 V is input to the input terminal 13, the voltage of the input signal IN is dropped to 3.3 V by the protective resistor 19, and is supplied to the internal circuit via the transfer gate 20.

Since the gate of the PMOS 18 is connected to the ground potential GND, the PMOS 18 is always in an ON state and the power supply voltage VCC is applied to the gate of the NMOS 16. Thus, a voltage between drain and gate regions of the NMOS 16 will not exceed 1.7 V even when an input signal IN of 5 V is input to the input terminal 13. Further, since a voltage at the internal node N1 is clamped at 3.3 minus Vth volts by the NMOS 16, a voltage at a drain-gate region of the NMOS 17 will not exceed the power supply voltage VCC.

When an electrostatic surge voltage is applied to the input terminal 13 with reference to the power supply terminal 11, a surge current flows from the input terminal 13 through the protective NMOSs 16 and 17 to the ground terminal 12. The surge current which has flowed to the ground terminal 12 flows into the power supply line 14 via a number of parasite diodes 21 formed between the ground line 15 and the power supply line 14, and finally reaches the power supply terminal 11 and is absorbed and dissipated.

At this time, the gate of the NMOS 16 is connected to the power supply line 14 via the PMOS 18. Therefore, an electrostatic surge voltage is not directly applied to the region between the gate of the NMOS 16 and the drain of the NMOS 16 connected to the input terminal 13.

As described above, the semiconductor device of the first embodiment is provided with the NMOSs 16 and 17 connected in series between the input terminal 13 and the ground terminal 12. The gate of the NMOS 16 is connected to the power supply potential VDD via the PMOS 18 which is always in the ON state, and the gate of the NMOS 17 is connected to the ground potential GND. Therefore, even when an input signal IN of a voltage greater than or equal to the power supply voltage VCC is input to the input terminal 13, a voltage equal to or exceeding the power supply voltage VCC is not applied to the NMOSs 16 and 17. Therefore, a withstand voltage of gate oxide films of the NMOSs 16 and 17 is sufficient at about 3.3 V, which is the same as that of a gate oxide film of a device forming the internal circuit, and the NMOSs 16 and 17 can be fabricated by a fabrication process similar to that for the internal circuit.

Further, when an electrostatic surge voltage is applied to the input terminal 13, since the surge current is input to the gate of the NMOS 16 via the PMOS 18, breakdown of the gate oxide film of the NMOS 16 can be prevented.

Second Embodiment

Figure 3:
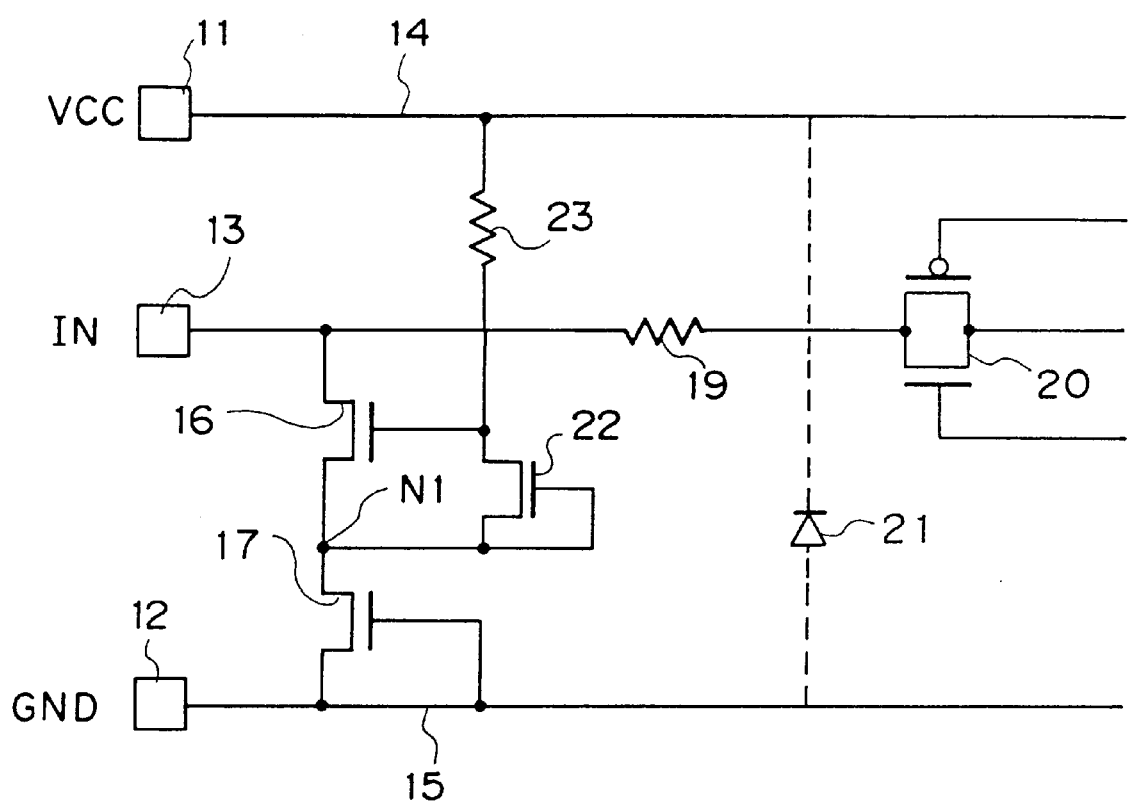
FIG. 3 illustrates an input circuit of a semiconductor device of a second embodiment of the present invention.

FIG. 3 illustrates an input circuit of a semiconductor device of a second embodiment of the present invention, and elements shared in common with those of FIG. 1 are designated with the same reference numerals.

In the semiconductor device, the PMOS 18 of FIG. 1 is replaced with a protective resistor 23, and an NMOS 22 is connected between a gate of an NMOS 16 and an internal node N1. That is, a drain of the NMOS 22 is connected to the gate of the NMOS 16, and a source and a gate of the NMOS 22 are connected to the internal node N1. Other structural features are the same as those in FIG. 1.

Figure 4A:
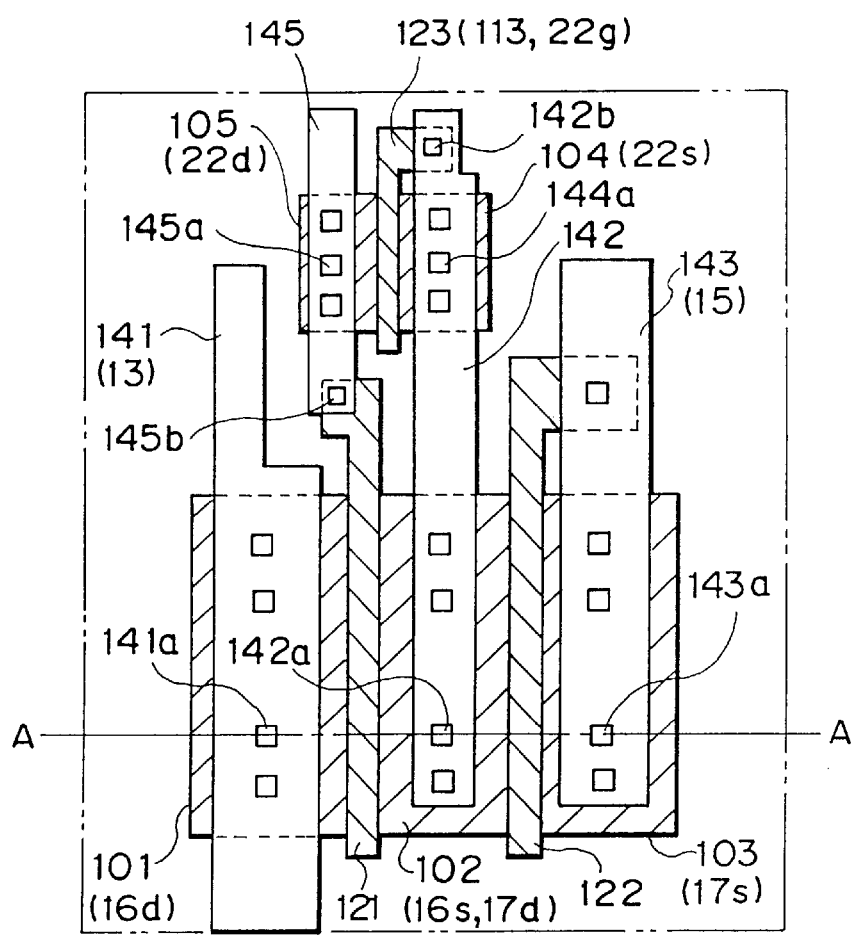
FIGS. 4A and 4B illustrate a structure of a main portion of the semiconductor device of FIG. 3.
Figure 4B:
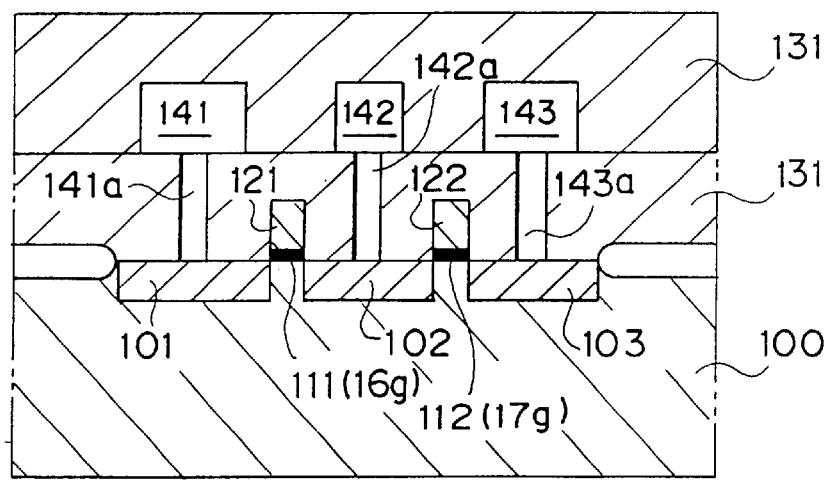

FIGS. 4A and 4B illustrate a structure of a main portion of the semiconductor device shown in FIG. 3. FIG. 4A is a plan view showing the semiconductor viewed through the surface thereof, and FIG. 4B is a sectional view taken along line A—A in FIG. 4A.

The semiconductor device has, on a P-type silicon substrate 100, N-type impurity diffusion layers 101, 102 and 103 formed parallel to each other and respectively corresponding to a drain 16d of the NMOS 16, a source 16s of the NMOS 16, i.e., a drain 17d of the NMOS 17, and a source 17s of the NMOS 17. Further, an N-type impurity diffusion layer 104 corresponding to a source 22s of the NMOS 22 is formed on an extension line of the N-type impurity diffusion layer 102, and an N-type impurity diffusion layer 105 corresponding to a drain 22d of the NMOS 22 is formed in parallel with the N-type impurity diffusion layer 104 and at a side of the N-type impurity diffusion layer 101.

A gate oxide film 111 corresponding to a gate 16g of the NMOS 16 is formed between the N-type impurity diffusion layers 101 and 102, and a polysilicon layer 121 for a gate electrode is formed on the gate oxide film 111. Further, a gate oxide film 112 corresponding to a gate 17g of the NMOS 17 is formed between the N-type impurity diffusion layers 102 and 103, and a polysilicon layer 122 for a gate electrode is formed on the gate oxide film 112. Furthermore, a gate oxide film 113 corresponding to a gate 22g of the NMOS 22 is formed between the N-type impurity diffusion layers 104 and 105, and a polysilicon layer 123 for a gate electrode is formed on the gate oxide film 113.

An inter-layer insulating layer 131 is formed over the N-type impurity diffusion layers 101–105 and the polysilicon layers 121–123.

Metal wiring layers 141, 143 and 145 respectively corresponding to the N-type impurity diffusion layers 101, 103 and 105 are formed on a surface of the inter-layer insulating layer 131, and the N-type impurity diffusion layers and the corresponding metal wiring layers are respectively connected via a plurality of inter-layer connection holes 141a, 143a and 145a respectively. Further, a continuous metal wiring layer 142 corresponding to the N-type impurity diffusion layers 102 and 104 is formed on the surface of the inter-layer insulating layer 131, and the metal wiring layer 142 and the N-type impurity diffusion layers 102 and 104 are respectively connected via a plurality of inter-layer connection holes 142a and 144a respectively.

Further, the metal wiring layers 142 and 145 are respectively connected to the polysilicon layers 123 and 121 via inter-layer wiring holes 142b and 145b. Furthermore, the metal wiring layer 141 is connected to the input terminal 13, and the metal wiring layer 143 is connected to the ground terminal 12 as the ground line 15.

Operation of the semiconductor device described above when an input signal IN of 5 V is input with respect to a power supply voltage VCC being 3.3 V is the same as that of FIG. 1.

Operation when an electrostatic surge voltage is applied between the power supply terminal 11 and the input terminal 13 is as follows.

An electrostatic surge current that has entered the input terminal 13 flows to the ground line 15 via the NMOSs 16 and 17, and then flows into the power supply line 14 via the parasitic diodes 21 between the ground line 15 and the power supply line 14, and is dissipated at the power supply terminal 11. During this process, when the surge current reaches the internal node N1, the NMOS 22 is turned ON, whereby the drain-gate region of the NMOS 16 is short-circuited so that the gate oxide film of the NMOS 16 is not broken.

As described above, the semiconductor device of the second embodiment employs the protective NMOSs 16 and 17 connected in series. The gate of the NMOS 16 is connected to the power supply potential VDD via the resistor 23, and the gate of the NMOS 17 is connected to the ground potential GND. Further, the NMOS 22 is provided for short-circuiting the gate-source region of the NMOS 16 when an electrostatic surge voltage is applied. Thus, in addition to the merits of the first embodiment, there is an additional merit in that breakdown of the gate oxide film of the NMOS 16 can be prevented more reliably.

Third Embodiment

Figure 5A:
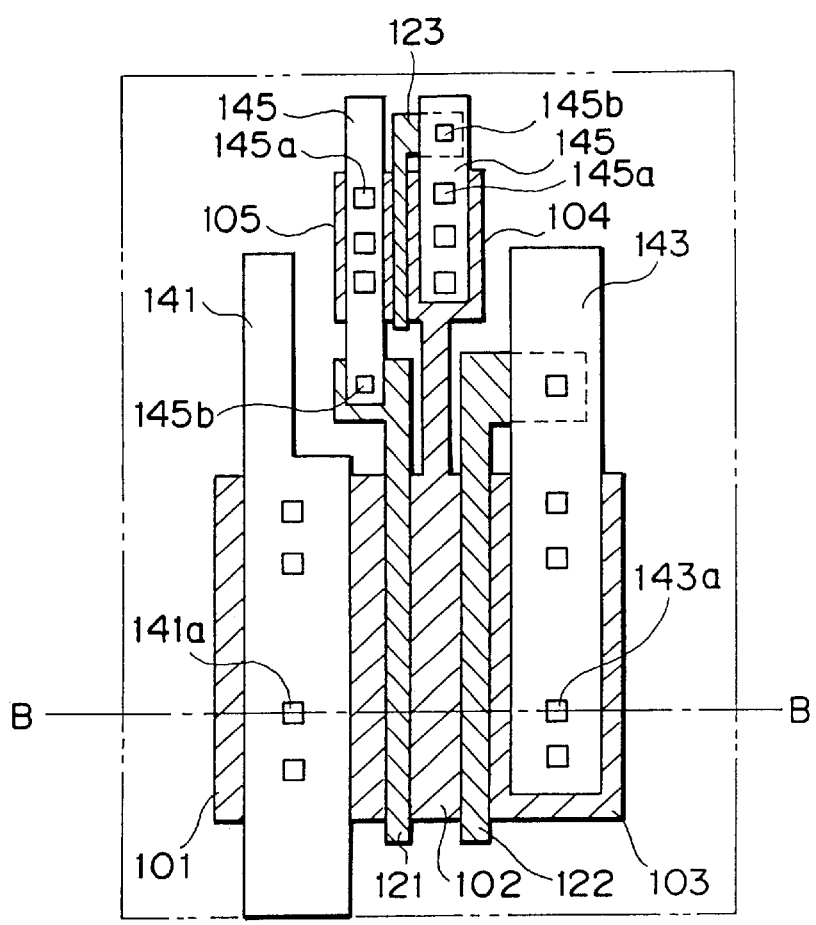
FIGS. 5A and 5B illustrate a structure of a main portion of a semiconductor device of a third embodiment of the present invention.
Figure 5B:
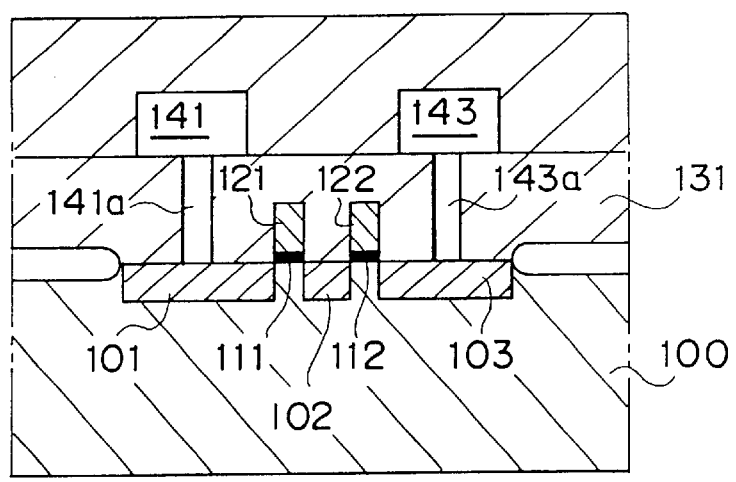

FIGS. 5A and 5B illustrate a structure of a main portion of a semiconductor device of a third embodiment of the present invention. FIG. 5A is a plan view looking through the surface the semiconductor, and FIG. 5B is a sectional view taken along line B—B in FIG. 5A. A circuit structure of the semiconductor device is the same as that of FIG. 3.

A major structural difference between this semiconductor device and that of FIGS. 4A–4D is that, as shown in FIG. 5A, an N-type impurity diffusion layer 102 corresponding to a source 16s of an NMOS 16, i.e., a drain 17d of an NMOS 17 is extended as far as an N-type impurity diffusion layer 104 corresponding to a source 22s of an NMOS 22, and the N-type impurity diffusion layers 102 and 104 are integrally formed. Accordingly, the metal wiring layer 142 and the inter-layer connection hole 142a for connecting the metal wiring layer 142 and the N-type impurity diffusion layer 102 shown in FIGS. 4A and 4B are not present. Other structural features are the same as those of FIGS. 4A and 4B.

As described above, in the semiconductor device of the third embodiment, the source 16s of the NMOS 16, i.e., the drain 17d of the NMOS 17, and the source 22s of the NMOS 22 are integrally formed by the N-type impurity diffusion layer. Thus, the metal wiring layer and the inter-layer connection hole for connecting the source 16s of the NMOS 16, i.e., the drain 17d of the NMOS 17, and the source 22s of the NMOS 22 become unnecessary. Consequently, in addition to the merits of the second embodiment, there is a further merit in that pattern area can be reduced.

Fourth Embodiment

Figure 6:
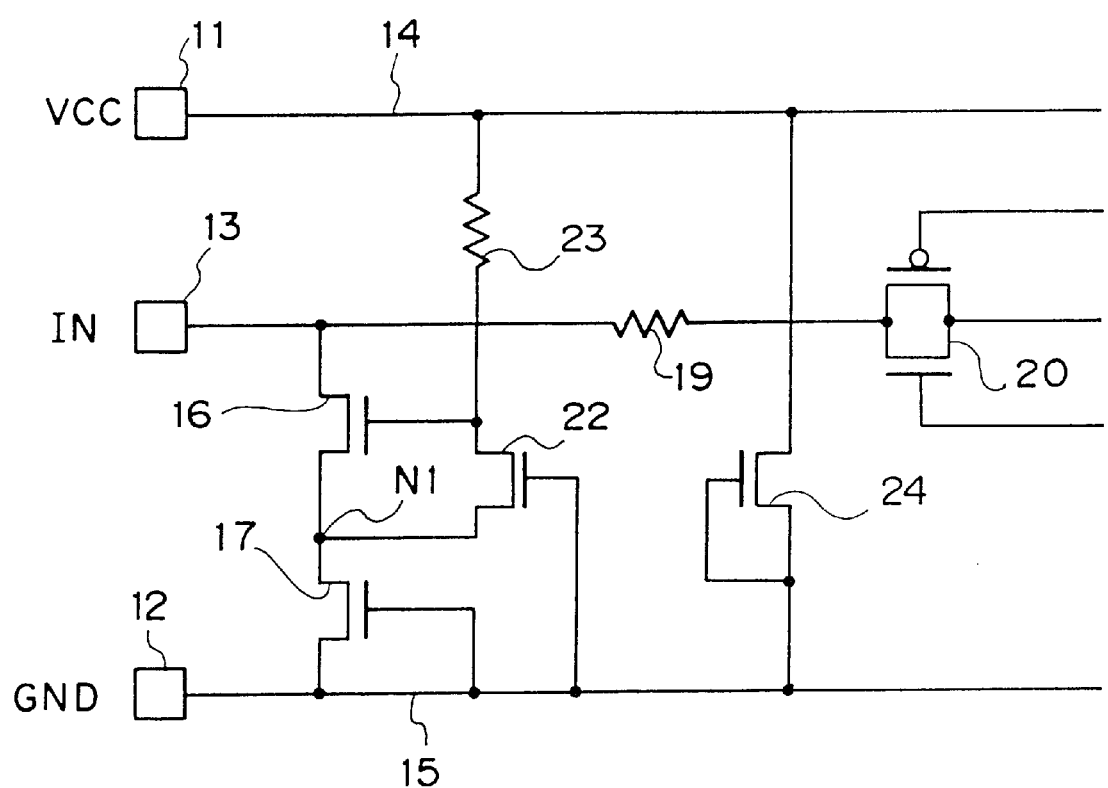
FIG. 6 illustrates an input circuit of a semiconductor device of a fourth embodiment of the present invention.

FIG. 6 illustrates an input circuit of a semiconductor device of a fourth embodiment of the present invention, and elements shared in common with those of FIG. 3 are designated with the same reference numerals.

The input circuit is applied to a semiconductor device having an SOI structure. The input circuit has a diode-connected NMOS 24 equivalent to parasitic diodes between a power supply line 14 and a ground line 15. That is, a drain of the NMOS 24 is connected to the power supply line 14, and a source and a gate of the NMOS 24 is connected to the ground line 15. Further, in this semiconductor device, the gate and the source of the NMOS 22 shown in FIG. 3 are disconnected, and the gate is connected to the ground line 15. Other structural features are the same as those of FIG. 3.

Figure 7A:
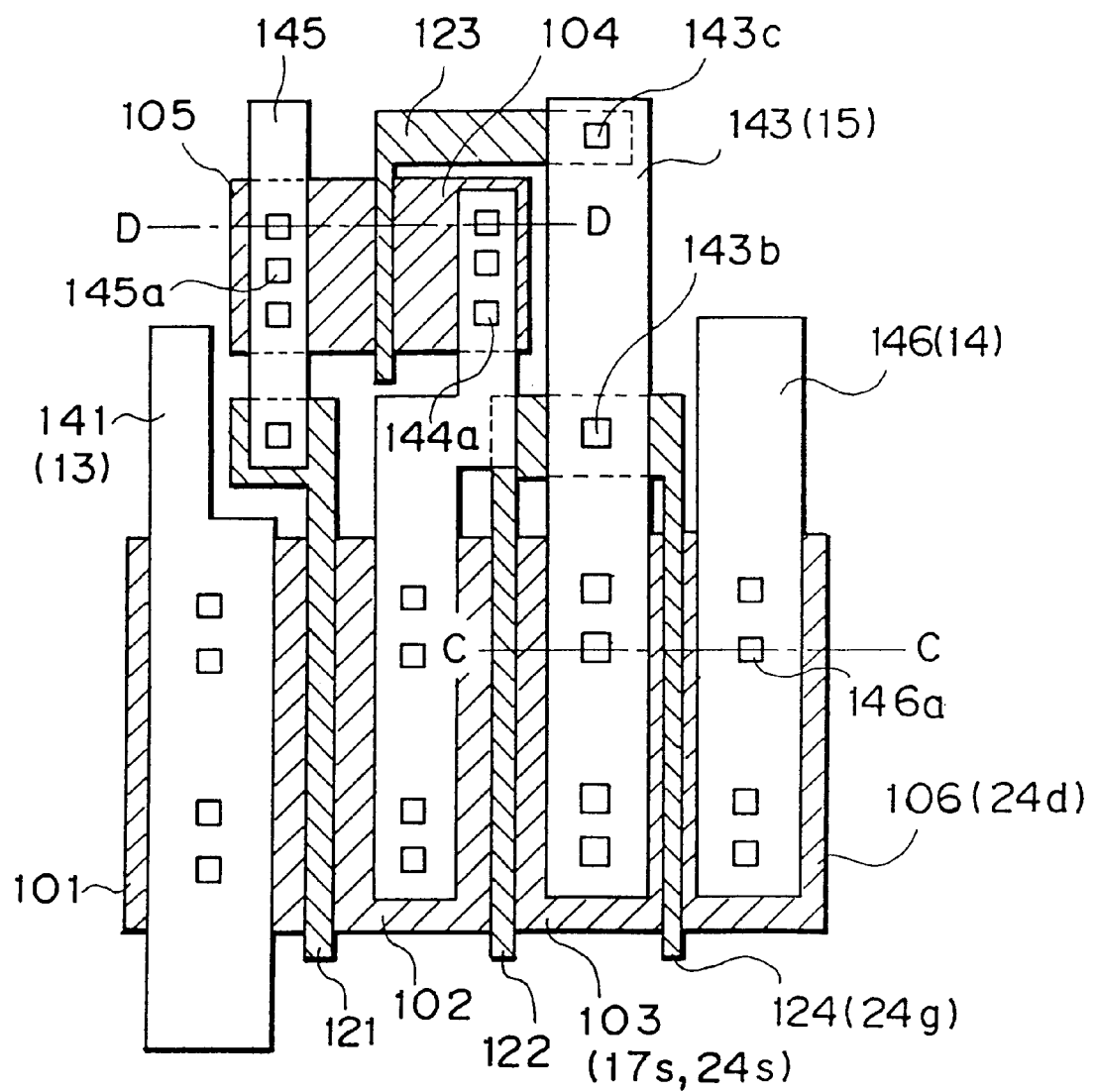
FIGS. 7A–7C illustrate a structure of a main portion of the semiconductor device of FIG. 6.
Figure 7B:
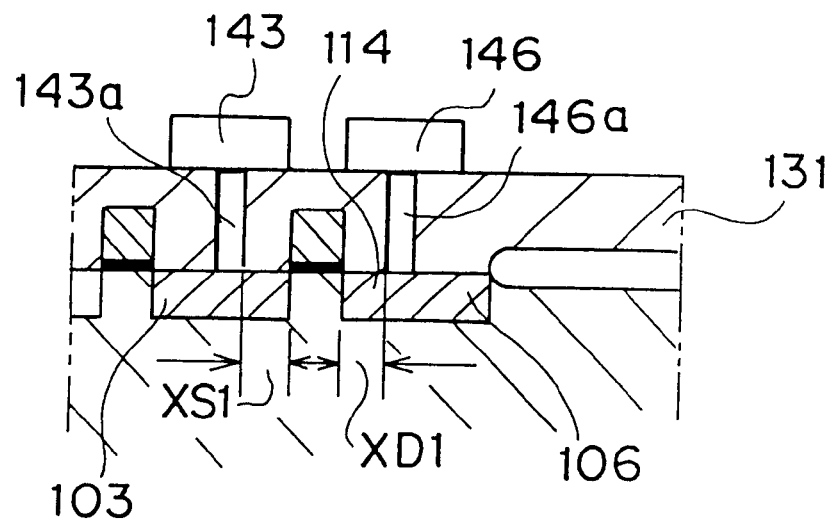
Figure 7C:
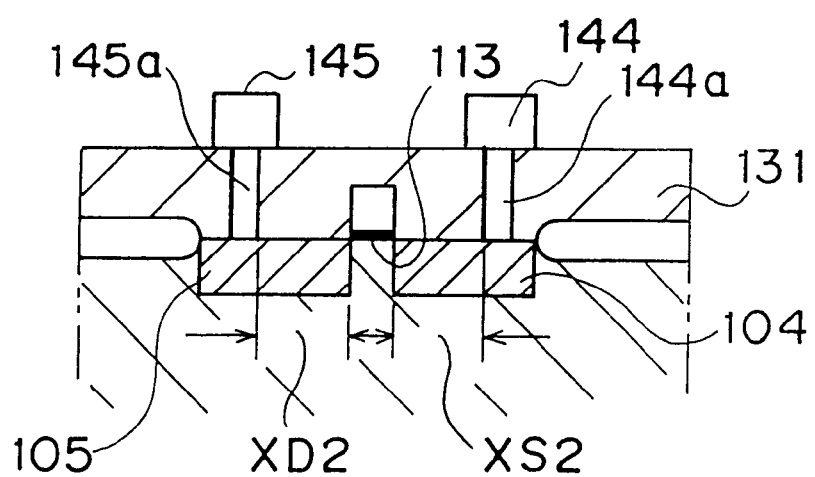

FIGS. 7A–7C illustrate a structure of a main portion of the semiconductor device of FIG. 6. FIG. 7A is a plan view looking through the surface of the semiconductor, and FIGS. 7B and 7C are sectional views taken respectively along line C—C and line D—D in FIG. 7A. In FIGS. 7A–7C, elements shared in common with those in FIGS. 4A and 4B are designated with the same reference numerals.

As shown in FIG. 7A, in the semiconductor device, an N-type impurity diffusion layer 106 corresponding to a drain 24d of the NMOS 24 is formed in parallel with an N-type impurity diffusion layer 103 on a P-type silicon substrate 100. The N-type impurity diffusion layer 103 forms a source 17s of an NMOS 17 and a source 24s of the NMOS 24.

An gate oxide film 114 corresponding to a gate 24g of the NMOS 24 is formed between the N-type impurity diffusion layers 103 and 106, and a polysilicon 124 for a gate electrode is formed on the gate oxide film 114. The polysilicon 124 is metal-connected to a metal wiring layer 143 corresponding to the ground line 15 via an inter-layer connection hole 143b.

A metal wiring layer 146 corresponding to the power supply line 14 is formed on the N-type impurity diffusion layer 106 with an inter-layer insulating layer 131 disposed therebetween, and the N-type impurity diffusion layer 106 and the metal wiring layer 146 are connected via a plurality of inter-layer connection holes 146a. Further, a polysilicon 123 corresponding to a gate of the NMOS 22 is connected to a metal wiring layer 143 corresponding to the ground line 15 via an inter-layer connection hole 143c.

In the semiconductor device, the size of the NMOS 22 is larger than the size of the NMOS 24. That is, as shown in FIGS. 7B and 7C, a distance XD2 between an inter-layer connection hole 145a at the side of the drain 22d of the NMOS 22 and a gate oxide film 113 is greater than a distance XD1 between an inter-layer connection hole 146a at the side of the drain 24d of the NMOS 24 and the gate oxide film 114. Further, a distance XS2 between an inter-layer connection hole 144a at the side of the source 22s of the NMOS 22 and the gate oxide film 113 is greater than a distance XS1 between the inter-layer connection hole 143a at the side of the source 24s of the NMOS 24 and the gate oxide film 114.

Operation of the semiconductor device as described above when an input signal IN of 5 V is input while a power supply voltage VCC is 3.3 V is the same as that of FIG. 1.

On the other hand, operation when an electrostatic surge voltage is applied between the power supply terminal 11 and the input terminal 13 is as follows.

An electrostatic surge current that has entered the input terminal 13 flows to the ground line 15 via the NMOSs 16 and 17, and then flows into the power supply line 14 via the NMOS 24 between the ground line 15 and the power supply line 14, and is dissipated at the power supply terminal 11. During this process, when the surge current reaches the source of the NMOS 16, the NMOS 22 is turned ON, thereby the drain-gate region of the NMOS 16 is short-circuited so that the gate oxide film of the NMOS 16 is not broken.

Further, when an electrostatic surge voltage is applied between the power supply terminal 11 and the ground terminal 12, the surge current branches off into two paths: a path through a resistor 23 and the NMOS 22 and 17, and a path through the NMOS 24. In this case, since the distances XS2 and XD2 between the gate electrode of the NMOS 22 and the inter-layer connection hole are shorter than the distances XS1 and XD1 between the gate electrode of the NMOS 24 and the inter-layer connection hole, the surge current is more likely to flow through the NMOS 24, and therefore the amount of surge current flowing toward the NMOS 22 is smaller.

As described above, the semiconductor device of the fourth embodiment has the NMOS 24 which is diode-connected between the power supply line 14 and the ground line 15. Thus, even in a semiconductor device having an SOI structure, effects the same as those of the third embodiment can be obtained. In addition, the dimension of the NMOS 24 is set so that a surge current is more likely to flow toward the NMOS 24 than toward the NMOS 22. This can prevent the NMOS 22 from being broken by a surge current when an electrostatic surge voltage is applied.

The present invention is not limited to the above described embodiments, and various changes can be made to the present invention. Examples of changes include following (a)–(d):

(a) A PMOS such as shown in FIG. 1 may be employed in place of the resistor 23 shown in FIGS. 3 and 6.

(b) The gate of the NMOS 22 shown in FIG. 3 may be connected to the ground line 15 instead of the internal node N1.

(c) If a reverse bias effect of the parasitic diodes 21 shown in FIGS. 1 and 3 is small, a diode-connected NMOS 24 may be employed, as shown in FIG. 6, in place of the parasitic diodes 21.

(d) The N-type impurity diffusion layers 102 and 104 shown in FIG. 7 may be integrally formed as shown in FIG. 5. This can reduce the area occupied by the semiconductor device since the metal wiring layer 142 and the inter-layer connection holes 142a and 144a become unnecessary.

What is claimed is:

1. A semiconductor device for receiving an input signal, and power supply voltages, the semiconductor device comprising:

an input line for receiving the input signal, first and second power supply lines for receiving power supply voltages, and an internal node;

a first MOS transistor of a first conductive type, the first MOS transistor having a source electrode, a drain electrode, and a gate electrode, with the drain electrode connected to the input line and the source electrode connected to the internal node;

a circuit element disposed between the first power supply line and the gate electrode of the first MOS transistor for applying a power supply voltage to the first MOS transistor gate electrode which maintains the first MOS transistor in an ON state;

a second MOS transistor of the first conductive type disposed between the second power supply line and the internal node, the second MOS transistor having a source electrode connected to the second power supply line, a drain electrode connected to the internal node, and a gate electrode connected to the second power supply; and a protection device connecting the gate electrode of the first MOS transistor and the internal node to one another.

2. The semiconductor device of claim 1, wherein the circuit element is a third MOS transistor of a second conductive type having a gate electrode connected to the power supply line, with the third MOS transistor being maintained in an ON state.

3. The semiconductor device of claim 1, wherein the circuit element is a resistor element.

4. The semiconductor of claim 1, wherein the protection device is a fourth MOS transistor of the first conductive type having a gate electrode connected to at least one of the internal node and the second power supply line, with the fourth MOS transistor being maintained in an OFF state.

5. The semiconductor device of claim 4, further comprising a fifth MOS transistor diode-connected in a reverse bias direction between the first and second power supply lines.

6. The semiconductor device of claim 4, wherein impurity diffusion layers respectively corresponding to source electrodes of the first and the fourth MOS transistors are integrally formed on a semiconductor substrate.

7. The semiconductor device of claim 5, wherein impurity diffusion layers respectively corresponding to source electrodes of the first and the fourth MOS transistors are integrally formed on a semiconductor substrate; and the fourth and the fifth MOS transistors are designed so that a distance between the gate electrode and a source contact hole of the fourth MOS transistor is longer than a distance between a gate electrode and a source contact hole of the fifth MOS transistor, and a distance between the gate electrode and a drain contact hole of the fourth MOS transistor is longer than a distance between the gate electrode and a drain contact hole of the fifth MOS transistor.

8. The semiconductor device of claim 1, further comprising a fifth MOS transistor diode-connected in a reverse bias direction between the first and second power supply lines.

* * * * *